(12) United States Patent
Zhang

(10) Patent No.: US 12,131,797 B2
(45) Date of Patent: Oct. 29, 2024

(54) DATA TRANSMISSION CIRCUIT, DATA TRANSMISSION METHOD AND MEMORY DEVICE

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/769,934

(22) PCT Filed: Aug. 12, 2021

(86) PCT No.: PCT/CN2021/112247
§ 371 (c)(1),
(2) Date: Apr. 18, 2022

(87) PCT Pub. No.: WO2022/217792
PCT Pub. Date: Oct. 20, 2022

(65) Prior Publication Data
US 2024/0304226 A1    Sep. 12, 2024

(30) Foreign Application Priority Data
Apr. 13, 2021  (CN) .......................... 202110397072.4

(51) Int. Cl.
  *G11C 7/10*    (2006.01)
(52) U.S. Cl.
  CPC ...... *G11C 7/1048* (2013.01); *G11C 2207/107* (2013.01)
(58) Field of Classification Search
  CPC .......................... G11C 7/1048; G11C 2207/107
  (Continued)

(56) References Cited

U.S. PATENT DOCUMENTS

| 11,113,218 B1 | 9/2021 | Yamanaka et al. |
| 2009/0276688 A1* | 11/2009 | Yoshida ................ H03M 13/09 714/699 |

(Continued)

FOREIGN PATENT DOCUMENTS

| CN | 1551242 A | 12/2004 |
| CN | 101667451 A | 3/2010 |

(Continued)

OTHER PUBLICATIONS

Non-final Office Action of U.S. Appl. No. 17/717,159, mailed Sep. 14, 2023.

(Continued)

*Primary Examiner* — Connie C Yoha
(74) *Attorney, Agent, or Firm* — Kilpatrick Townsend & Stockton LLP

(57) ABSTRACT

A data transmission circuit, method and memory device are provided. A comparison circuit is configured to compare global data with bus data to output a comparison result on whether the number of different bits between the global data and the bus data exceeds a preset threshold; a correction circuit is configured to check and/or correct the global data to generate corrected data; a first data conversion circuit is configured to invert the corrected data and transmit the inverted corrected data to the data bus when exceeding the preset threshold, and transmit the corrected data to the data bus when not exceeding the preset threshold, and the first data conversion circuit is further configured to output a mark signal; and a recovery circuit is configured to transmit data or inverted data on the data bus to a serial-parallel conversion circuit according to a value of the mark signal.

20 Claims, 13 Drawing Sheets

(58) Field of Classification Search
USPC .................................................... 365/189.18
See application file for complete search history.

(56) References Cited

U.S. PATENT DOCUMENTS

| | | | |
|---|---|---|---|
| 2011/0035644 A1 | 2/2011 | Madan | |
| 2011/0280296 A1 | 11/2011 | Wang et al. | |
| 2016/0225417 A1* | 8/2016 | Lim .......................... | G11C 7/12 |
| 2020/0341869 A1 | 10/2020 | Langadi et al. | |
| 2022/0310139 A1 | 9/2022 | Zhang | |

FOREIGN PATENT DOCUMENTS

| | | |
|---|---|---|
| CN | 103780506 A | 5/2014 |
| CN | 105634504 A | 6/2016 |
| CN | 107222298 A | 9/2017 |
| CN | 109036240 A | 12/2018 |
| CN | 210667806 U | 6/2020 |
| CN | 211404066 U | 9/2020 |
| CN | 111951855 A | 11/2020 |
| CN | 112309484 A | 2/2021 |
| WO | 2019127350 A1 | 7/2019 |

OTHER PUBLICATIONS

Non-final Office Action of U.S. Appl. No. 17/715,943, mailed May 25, 2023.

* cited by examiner

DATA TRANSMISSION CIRCUIT, DATA TRANSMISSION METHOD AND MEMORY DEVICE

CROSS-REFERENCE TO RELATED APPLICATIONS

The present disclosure is a national stage entry of International Patent Application No. PCT/CN2021/112247, filed on Aug. 12, 2021, which claims priority to Chinese patent application No. 202110397072.4, filed on Apr. 13, 2021 and entitled "Data Transmission Circuit, Data Transmission Method and Memory Device", the disclosure of which is hereby incorporated by reference in its entirety.

TECHNICAL FIELD

The present disclosure relates to the technical field of semiconductor storage, and in particular relates to a data transmission circuit, a data transmission method and a memory device.

BACKGROUND

With the rapid development of semiconductor technologies, the density and the number of memory cells in a memory cell array of a semiconductor memory device are increasing to meet the market demand for the storage capacity of the semiconductor memory device. In order to improve the speed and the efficiency of writing data into or reading data from the semiconductor memory device, a prefetch mode is generally used to write data into or read data from the semiconductor memory device.

The increase of the density and the number of the memory cells in the memory cell array leads to the increase of the length of a data transmission path between a data pad and a memory cell, resulting in a significant increase in power consumption in the process of data transmission.

If the power consumption in the process of reading data from a memory cell array can be reduced and the accuracy of read data can be improved without reducing the density and the number of the memory cells in the memory cell array, the energy-saving performance and the storage performance of the semiconductor memory device will be effectively improved.

SUMMARY

The present disclosure relates to a data transmission circuit, a data transmission method and a memory device.

An aspect of the embodiments of the present disclosure provides a data transmission circuit, which includes a comparison circuit, a correction circuit, a first data conversion circuit and a recovery circuit. The comparison circuit is electrically connected with a global data line and a data bus, and is configured to receive global data on the global data line and bus data on the data bus and compare the global data with the bus data to output a comparison result on whether the number of different bits between the global data and the bus data exceeds a preset threshold, wherein the global data and the bus data have a same preset bit width. The correction circuit is electrically connected with the global data line, and is configured to receive the global data and check data on the global data line, check and/or correct the global data according to the check data to generate corrected data. The first data conversion circuit is electrically connected with the data bus, the comparison circuit and the correction circuit, and is configured to invert the corrected data and transmit the inverted corrected data to the data bus when the comparison result is indicative of exceeding the preset threshold, and transmit the corrected data to the data bus when the comparison result is indicative of not exceeding the preset threshold. The first data conversion circuit is further configured to output a mark signal for representing whether the comparison result is indicative of exceeding the preset threshold. The recovery circuit is electrically connected with the data bus and a serial-parallel conversion circuit, and is configured to transmit data on the data bus or inverted data on the data bus to the serial-parallel conversion circuit according to a value of the mark signal.

Another aspect of the embodiments of the present disclosure provides a memory device, which includes the data transmission circuit described above, and is configured to store and transmit data of a read operation or a write operation.

Yet another aspect of the embodiments of the present disclosure provides a data transmission method, which includes: global data on a global data line and bus data on a data bus are received, and the global data is compared with the bus data to output a comparison result on whether the number of different bits between the global data and the bus data exceeds a preset threshold, wherein the global data and the bus data have a same preset bit width; check data on the global data line is received, and the global data is checked and/or corrected according to the check data to generate corrected data; a mark signal for representing whether the comparison result is indicative of exceeding the preset threshold is generated according to the comparison result, the corrected data is inverted and transmitted to the data bus when the comparison result is indicative of exceeding the preset threshold, and the corrected data is transmitted to the data bus when the comparison result is indicative of not exceeding the preset threshold; and data on the data bus or inverted data on the data bus is transmitted to a serial-parallel conversion circuit according to a value of the mark signal.

Details of the various embodiments of the present disclosure will be described in drawings and descriptions below. According to records of description, drawings and claims, those having ordinary skill in the art will easily understand other features, solved problems and technical effects of the embodiments of the present disclosure.

BRIEF DESCRIPTION OF THE DRAWINGS

In order to describe the technical solutions in the embodiments of the present disclosure more clearly, the drawings referred to in descriptions about the embodiments will be simply introduced below. It is apparent that the drawings described below are only related to some embodiments of the present disclosure. Other drawings may further be obtained by those having ordinary skill in the art according to these drawings without creative work.

DETAILED DESCRIPTION OF THE EMBODIMENTS

In order to make facilitate the understanding of the embodiments of the present disclosure, the embodiments of the present disclosure will be described more comprehensively below with reference to the related drawings. The drawings show exemplary embodiments of the present disclosure. However, the present disclosure may be implemented in various forms and is not limited to the embodiments described herein. Instead, these embodiments are provided to make the contents disclosed in the present disclosure understood more thoroughly and comprehensively.

Unless otherwise defined, all technical and scientific terms used herein have the same meanings as commonly understood by those having ordinary skill in the art that the present disclosure belongs to. Herein, terms used in the description are only for the purpose of describing exemplary embodiments and not intended to limit the present disclosure. In addition, certain terms used throughout the specification and the following claims refer to specific elements. Those having ordinary skill in the art will appreciate that different manufacturers may refer to the elements with different names. This document does not intend to distinguish the elements with different names but same functionality. In the following description and embodiments, both the terms "comprising" and "including" are used openly, and therefore should be interpreted as "comprising, but not limited to . . . ". Likewise, the term "connect" is intended to express an indirect or direct electrical connection. Correspondingly, if one device is connected to another device, the connection may be done through a direct electrical connection, or through an indirect electrical connection via another device and a connector.

It is to be understood that, although the terms "first," "second," and the like may be used herein to describe various elements, these elements should not be limited by these terms. These terms are only used to distinguish one element from another. For example, a first element could be referred to as a second element, and, similarly, a second element could be referred to as a first element, without departing from the scope of the present disclosure.

Figure 1:
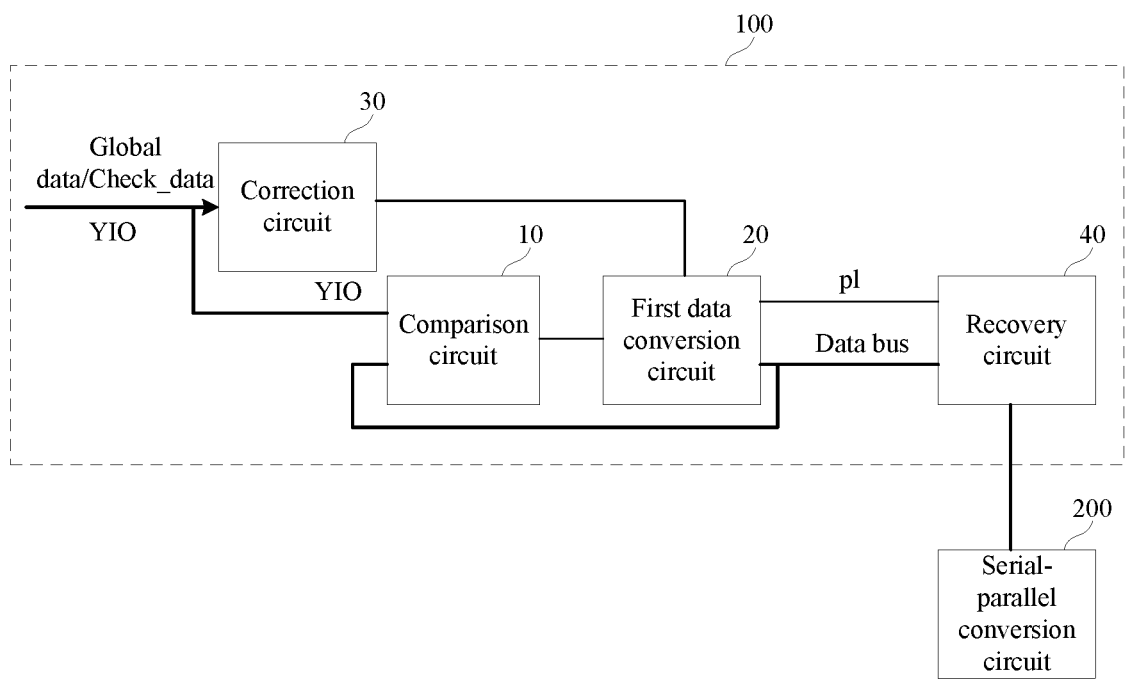
FIG. 1 is a schematic diagram of a circuit principle of a data transmission circuit provided in the first embodiment of the present disclosure.

Please refer to FIG. 1, in an embodiment of the present disclosure, a data transmission circuit 100 is provided, which includes a comparison circuit 10, a first data conversion circuit 20, a correction circuit 30 and a recovery circuit 40. The comparison circuit 10 is electrically connected with a global data line YIO and a data bus, and is configured to receive global data on the global data line YIO and bus data on the data bus and compare the global data with the bus data to output a comparison result on whether the number of different bits between the global data and the bus data exceeds a preset threshold, wherein the global data and the bus data have a same preset bit width. The correction circuit 30 is electrically connected with the global data line YIO, and is configured to receive the global data on the global data line YIO and check data on the global data line YIO, and check and/or correct the global data according to the check data to generate corrected data. The first data conversion circuit 20 is electrically connected with the data bus, the comparison circuit 10 and the correction circuit 30, and is configured to invert the corrected data and transmit the inverted corrected data to the data bus when the comparison result is indicative of exceeding the preset threshold, and transmit the corrected data to the data bus when the comparison result is indicative of not exceeding the preset threshold. The first data conversion circuit 20 also outputs a mark signal pl for representing whether the comparison result is indicative of exceeding the preset threshold. The recovery circuit 40 is electrically connected with the data bus and a serial-parallel conversion circuit 200, and is configured to transmit data on the data bus or inverted data on the data bus to the serial-parallel conversion circuit 200 according to a value of the mark signal pl.

Please continuously refer to FIG. 1, the comparison circuit 10 is configured to compare the global data on the global data line YIO and the bus data on the data bus and output a comparison result on whether the number of different bits between the global data and the bus data exceeds the preset threshold, wherein the global data and the bus data have a same preset bit width. For example, the preset threshold may be set to half of the preset bit width. Moreover, the correction circuit 30 is configured to check and/or correct the global data according to the received check data to generate corrected data. Therefore, the first data conversion circuit 20 is configured to invert the corrected data and transmit the inverted corrected data to the data bus when the comparison result is indicative of exceeding the preset threshold, and transmit the corrected data to the data bus when the comparison result is indicative of not exceeding the preset threshold. The first data conversion circuit 20 is further configured to output a mark signal pl for representing whether the comparison result is indicative of exceeding the preset threshold. Therefore, the recovery circuit 40 may be configured to transmit data on the data bus or inverted data on the data bus to the serial-parallel conversion circuit 200 according to a value of the mark signal pl. Without changing the transmission path of read data, the embodiment reduces the number of data flipping in the process of batch output of the read data through the global data line YIO, the data bus and the serial-parallel conversion circuit 200, and effectively reduces the power consumption in the process of read data transmission. Since the read data is the data after error detection (or referred to as checking)

and/or error correction by the correction circuit 30, the accuracy of the read data is guaranteed. Therefore, the embodiment reduces the power consumption in the process of reading data from a memory cell array and improves the accuracy of the read data without reducing the density and the number of memory cells in a memory cell array.

Figure 2:
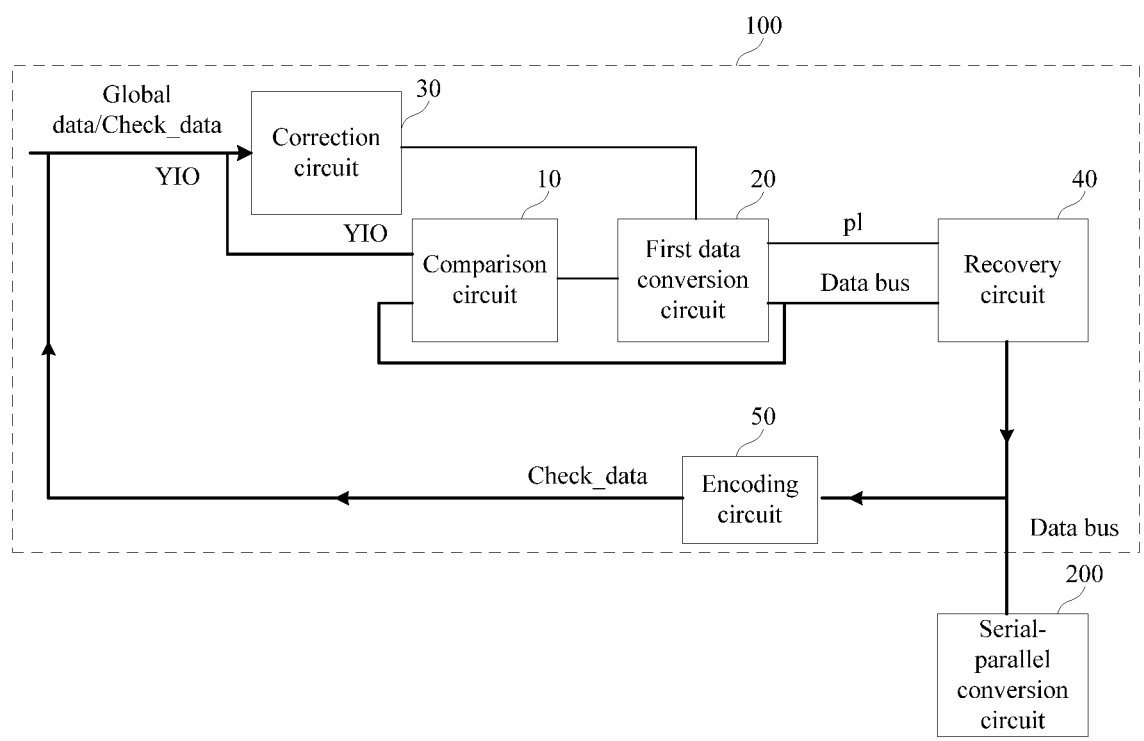
FIG. 2 is a schematic diagram of a circuit principle of a data transmission circuit provided in the second embodiment of the present disclosure.

Further, please refer to FIG. 2, in an embodiment of the present disclosure, the data transmission circuit 100 may also include an encoding circuit 50. The encoding circuit 50 is electrically connected with the global data line YIO and the data bus, and is configured to generate check data according to the bus data on the data bus during a write operation and transmit the check data to the global data line YIO. The bit width of the check data may be different from the preset bit width. The encoding circuit 50 is configured to generate the check data according to the bus data on the data bus during a write operation, so that the correction circuit 30 can perform error detection and/or error correction on the global data according to the check data during the read operation to ensure the accuracy of the read data.

As an example, please continuously refer to FIG. 2, in an embodiment of the present disclosure, the encoding circuit 50 may include an Elliptic Curve Cryptography (ECC) coding subcircuit, which checks the global data and generates an ECC check code, so that the correction circuit 30 may check and/or correct the global data according to the ECC check code to ensure the accuracy of the read data.

As an example, please continuously refer to FIG. 2, in an embodiment of the present disclosure, the length of a data transmission path between the recovery circuit 40 and the serial-parallel conversion circuit 200 is shorter than the length of a data transmission path between the recovery circuit 40 and the first data conversion circuit 20, thereby reducing the length of a data transmission path during the transmission of the data output from the recovery circuit 40 to the serial-parallel conversion circuit 200, thus, the probability of abnormality of the read data in the transmission process of the data transmission path is reduced to ensure the accuracy of the read data.

Figure 3:
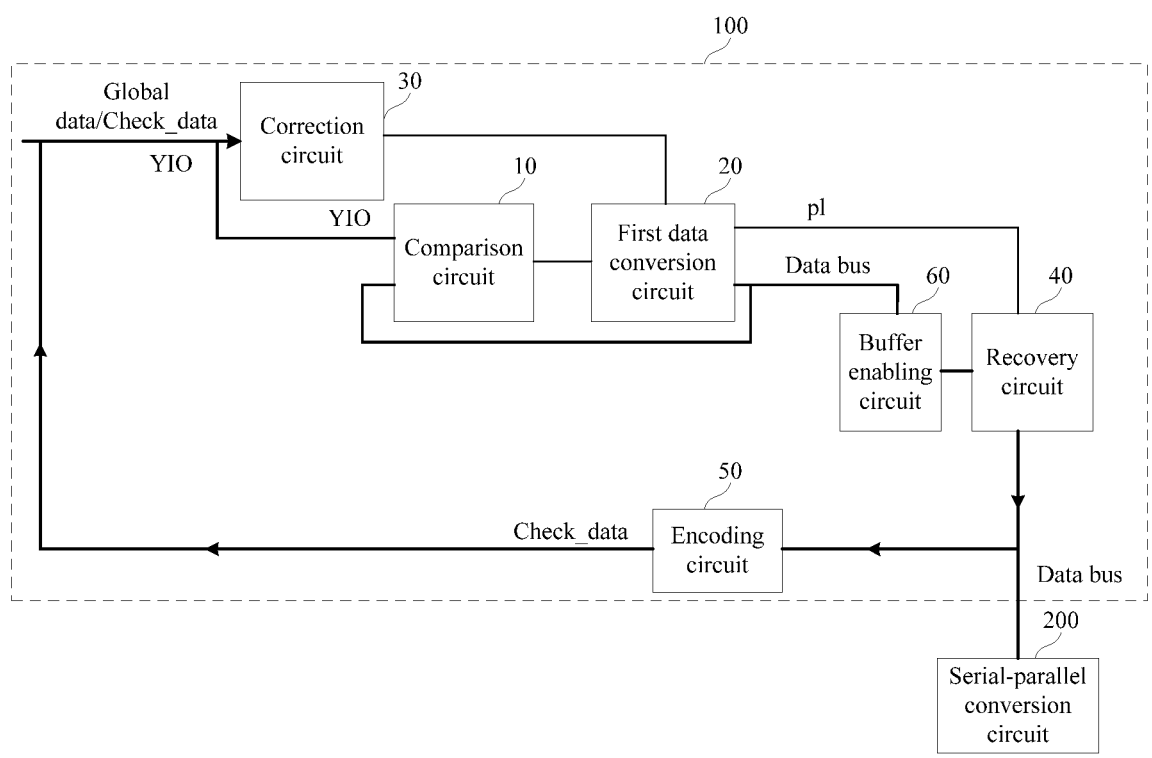
FIG. 3 is a schematic diagram of a circuit principle of a data transmission circuit provided in the third embodiment of the present disclosure.

Further, please refer to FIG. 3, in an embodiment of the present disclosure, the data transmission circuit 100 may also include at least one buffer enabling circuit 60. The first data conversion circuit 20 is sequentially connected with the recovery circuit 40 through at least one buffer enabling circuit 60, so as to buffer the data transmitted by the data bus. While ensuring the accuracy of the read data in the transmission process through the data bus with a relatively long transmission path, the input current of the data bus is reduced, so as to further reduce the power consumption of the read data in the data transmission process.

Figure 4:
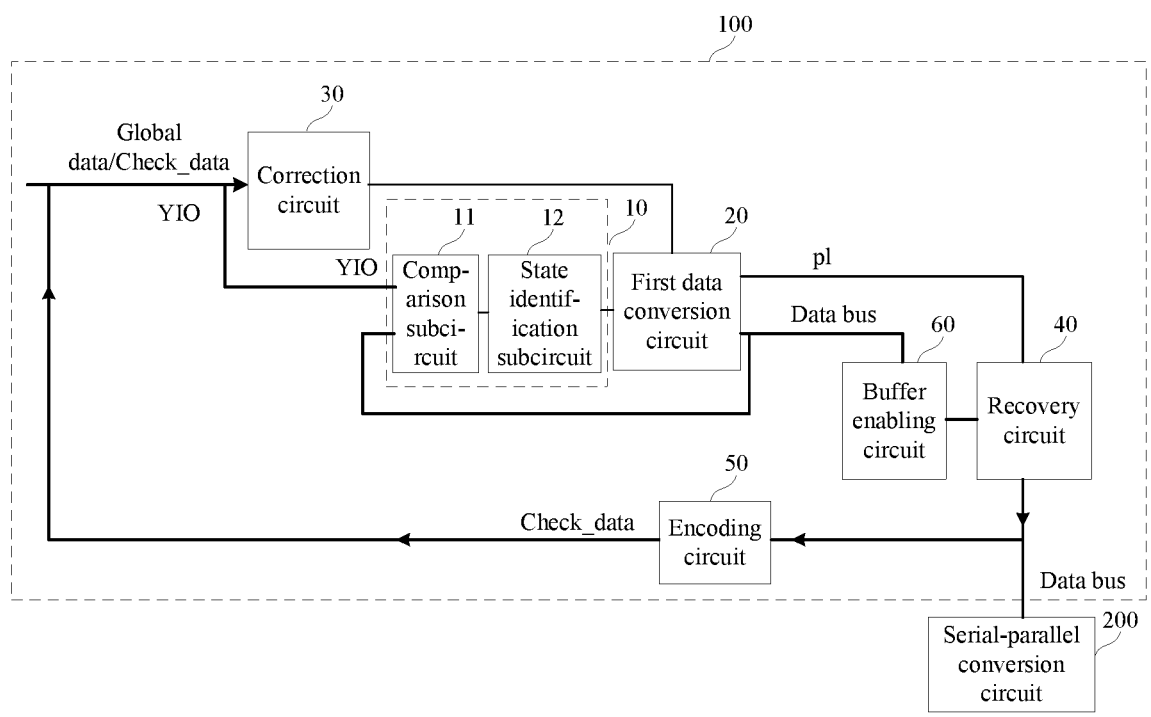
FIG. 4 is a schematic diagram of a circuit principle of a data transmission circuit provided in the fourth embodiment of the present disclosure.

Further, please refer to FIG. 4, in an embodiment of the present disclosure, the preset threshold may be set to half of the preset bit width. The comparison circuit 10 may include a comparison subcircuit 11 and a state identification subcircuit 12. The comparison subcircuit 11 is configured to compare the global data and bus data bit by bit, and output comparison state data for each bit. The state identification subcircuit 12 is electrically connected with the comparison subcircuit 11 and the first data conversion circuit 20, and is configured to make statistics on the comparison state data for each bit and generate the comparison result according to a statistical result.

Figure 5A:
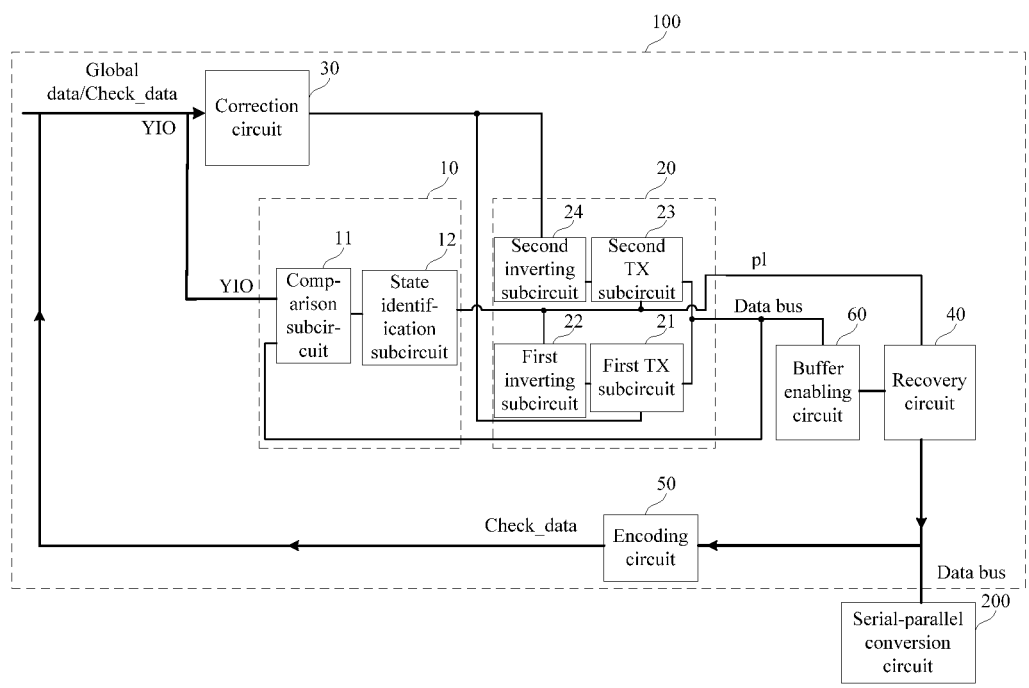
FIG. 5A is a schematic diagram of a circuit principle of a data transmission circuit provided in the fifth embodiment of the present disclosure.
Figure 5B:
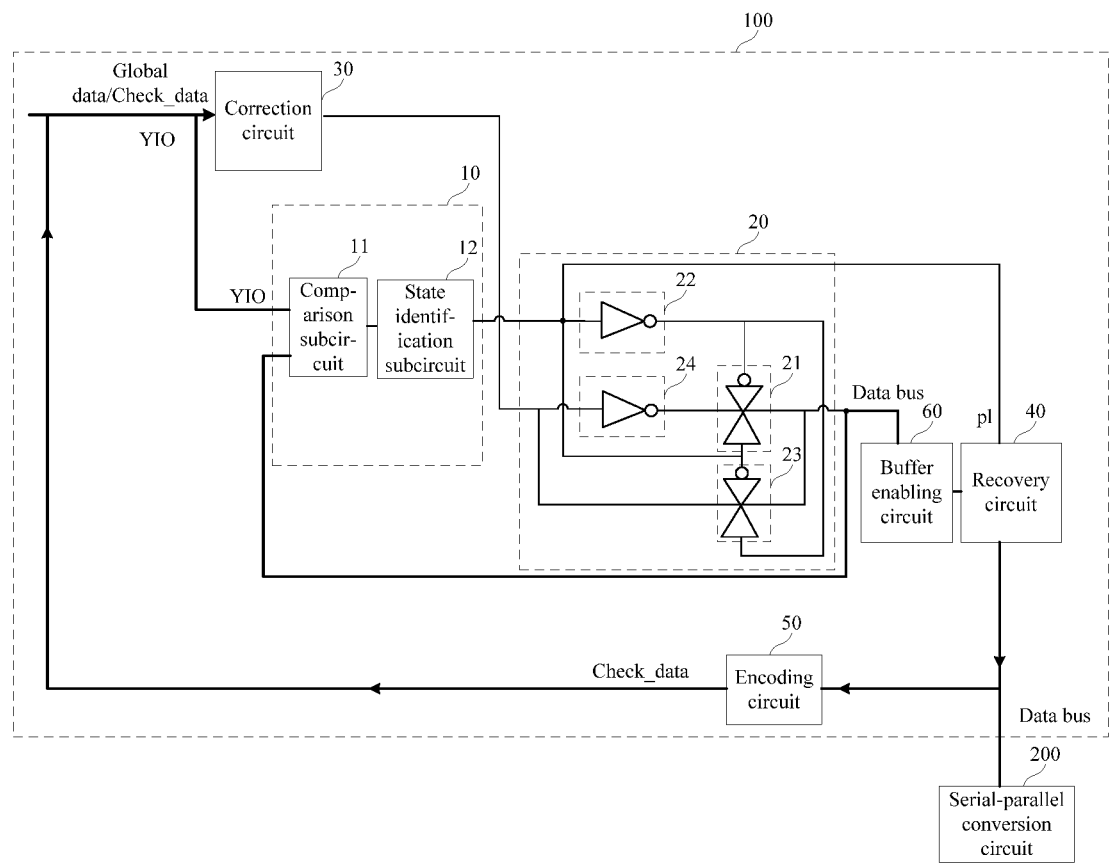
FIG. 5B is a schematic diagram of an implementation in FIG. 5A.

As an example, please refer to FIG. 5A and FIG. 5B, in an embodiment of the present disclosure, the first data conversion circuit 20 may include a first transmission subcircuit 21, a first inverting subcircuit 22, a second transmission subcircuit 23 and a second inverting subcircuit 24. The first transmission subcircuit 21 is electrically connected to the data bus and the correction circuit 30, and is electrically connected to an output end of the state identification subcircuit 12 through the first inverting subcircuit 22, and is configured to transmit the corrected data to the data bus when the comparison result is indicative of not exceeding the preset threshold. The second transmission subcircuit 23 is electrically connected to the data bus and the output end of the state identification subcircuit 12, and is electrically connected to the correction circuit 30 through the second inverting subcircuit 24, and is configured to invert the corrected data and transmit the inverted corrected data to the data bus when the comparison result is indicative of exceeding the preset threshold.

As an example, please continuously refer to FIG. 5A and FIG. 5B, in an embodiment of the present disclosure, the recovery circuit 40 is configured to invert the data on the data bus and transmit the inverted data to the serial-parallel conversion circuit 200 when the comparison result output by the comparison circuit 10 is indicative of exceeding the preset threshold, and transmit the data on the data bus to the serial-parallel conversion circuit 200 when the comparison result output by the comparison circuit 10 is indicative of not exceeding the preset threshold, so as to restore the previously inverted data and ensure the accuracy of the read data. The recovery circuit 40 may be configured as a circuit similar to the first data conversion circuit 20 or other circuits capable of restoring the previously inverted data.

Figure 6:
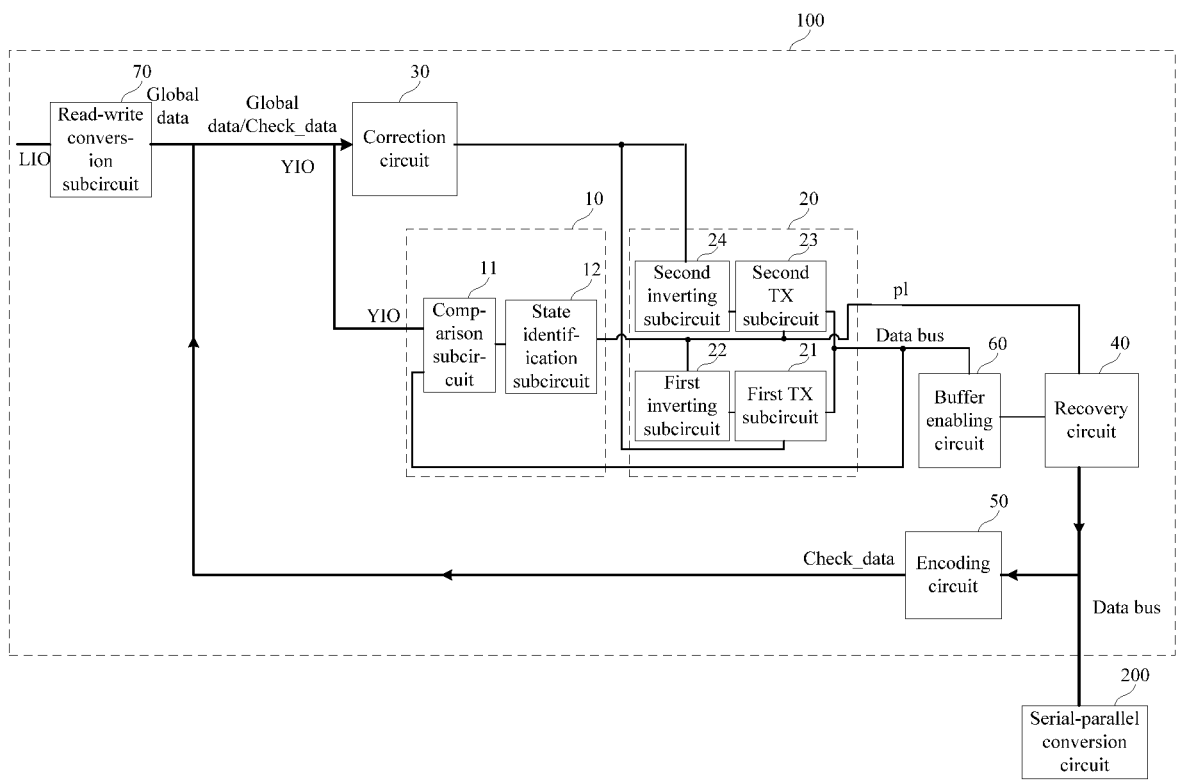
FIG. 6 is a schematic diagram of a circuit principle of a data transmission circuit provided in the sixth embodiment of the present disclosure.

Further, please refer to FIG. 6, in an embodiment of the present disclosure, the data transmission circuit 100 may also include a read-write conversion subcircuit 70. The read-write conversion subcircuit 70 is electrically connected with a local data line LIO and the global data line YIO, and is configured to, in response to a read command, generate global data according to data on the local data line LIO, and transmit the global data to the global data line YIO.

Figure 7:
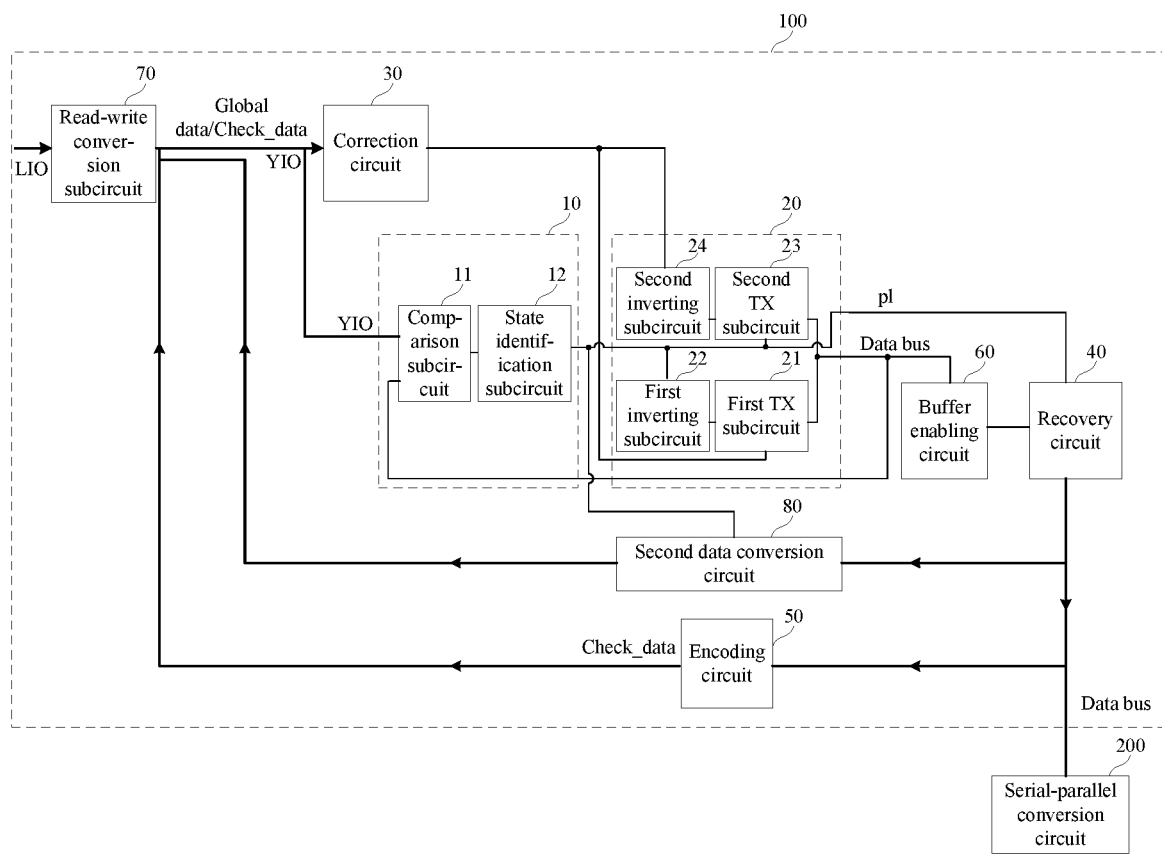
FIG. 7 is a schematic diagram of a circuit principle of a data transmission circuit provided in the seventh embodiment of the present disclosure.

Further, referring to FIG. 7, in an embodiment of the present disclosure, the data transmission circuit 100 may also include a second data conversion circuit 80. The second data conversion circuit 80 is configured to invert the data on the data bus and transmit the inverted data to the global data line YIO when the comparison result is indicative of exceeding the preset threshold, and transmit the data on the data bus to the global data line YIO when the comparison result is indicative of not exceeding the preset threshold.

Figure 8A:
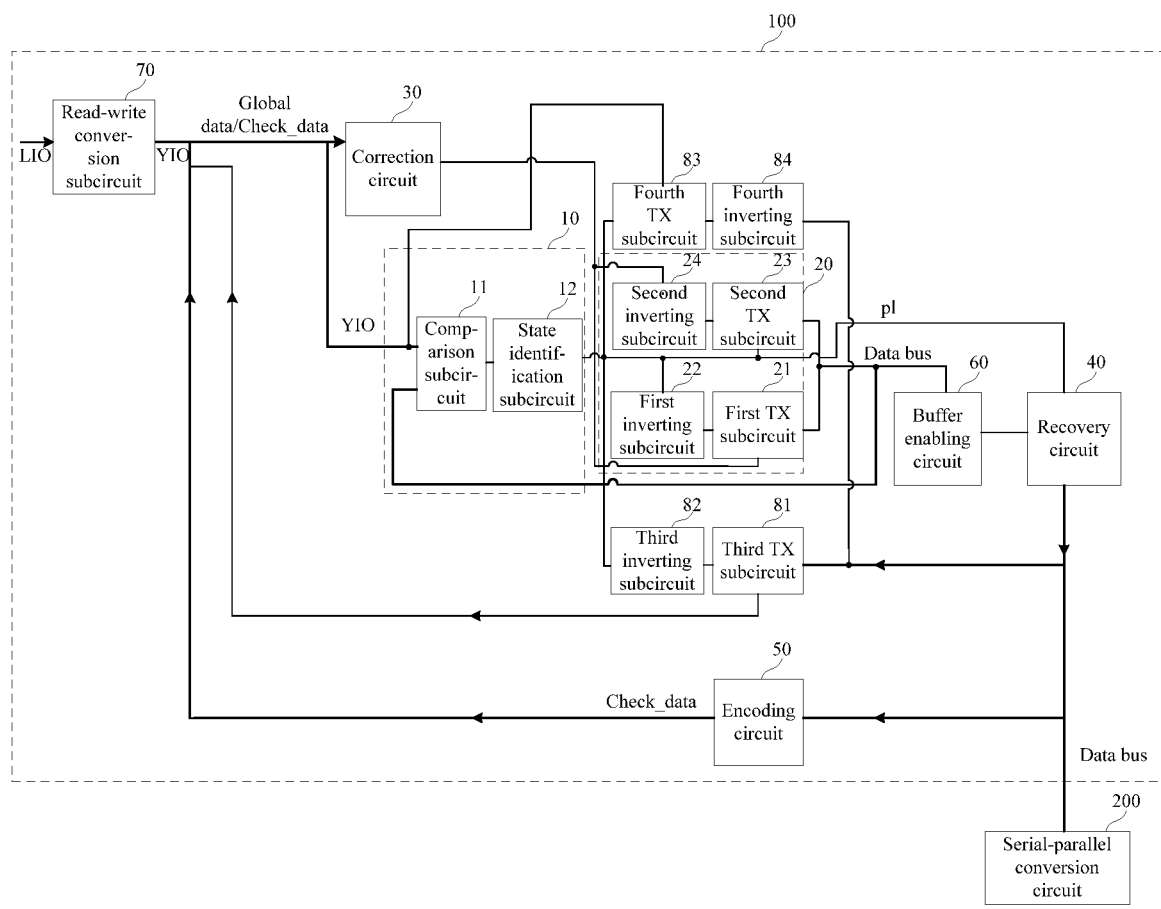
FIG. 8A is a schematic diagram of a circuit principle of a data transmission circuit provided in the eighth embodiment of the present disclosure.
Figure 8B:
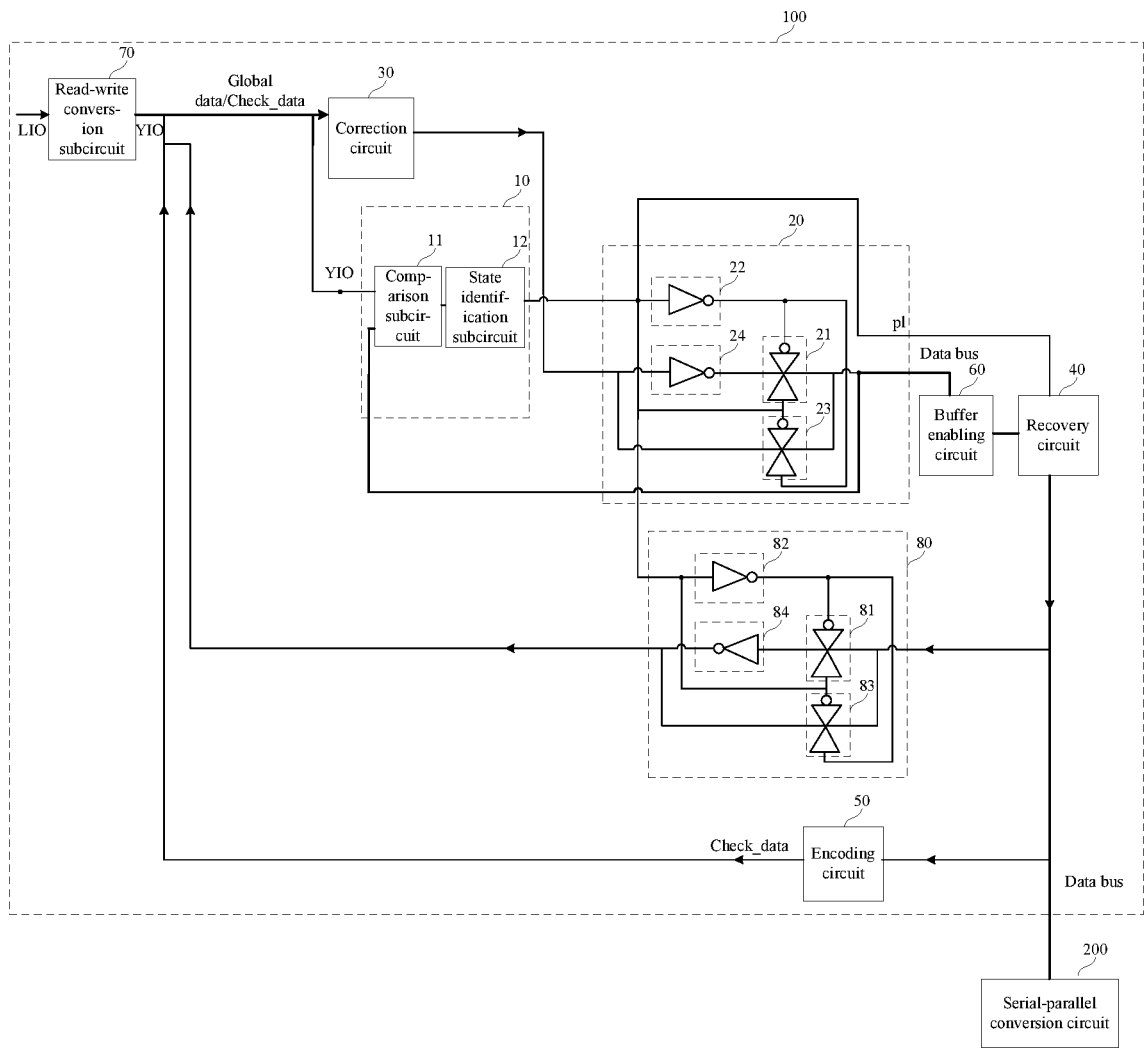
FIG. 8B is a schematic diagram of an implementation in FIG. 8A.

As an example, please refer to FIG. 8A and FIG. 8B, in an embodiment of the present disclosure, the second data conversion circuit 80 may include a third transmission subcircuit 81, a third inverting subcircuit 82, a fourth transmission subcircuit 83 and a fourth inverting subcircuit 84. The third transmission subcircuit 81 is electrically connected to the data bus and the global data line YIO, and is electrically connected to an output end of the comparison circuit 10 through the third inverting subcircuit 82, and is configured to transmit the data on the data bus to the global data line YIO when the comparison result is indicative of not exceeding the preset threshold. The fourth transmission subcircuit 83 is electrically connected to the global data line YIO and the output end of the comparison circuit 10, and is electrically connected to the data bus through the fourth inverting subcircuit 84, and is configured to invert the data on the data bus and transmit the inverted data to the global data line YIO when the comparison result is indicative of exceeding the preset threshold.

Figure 9:
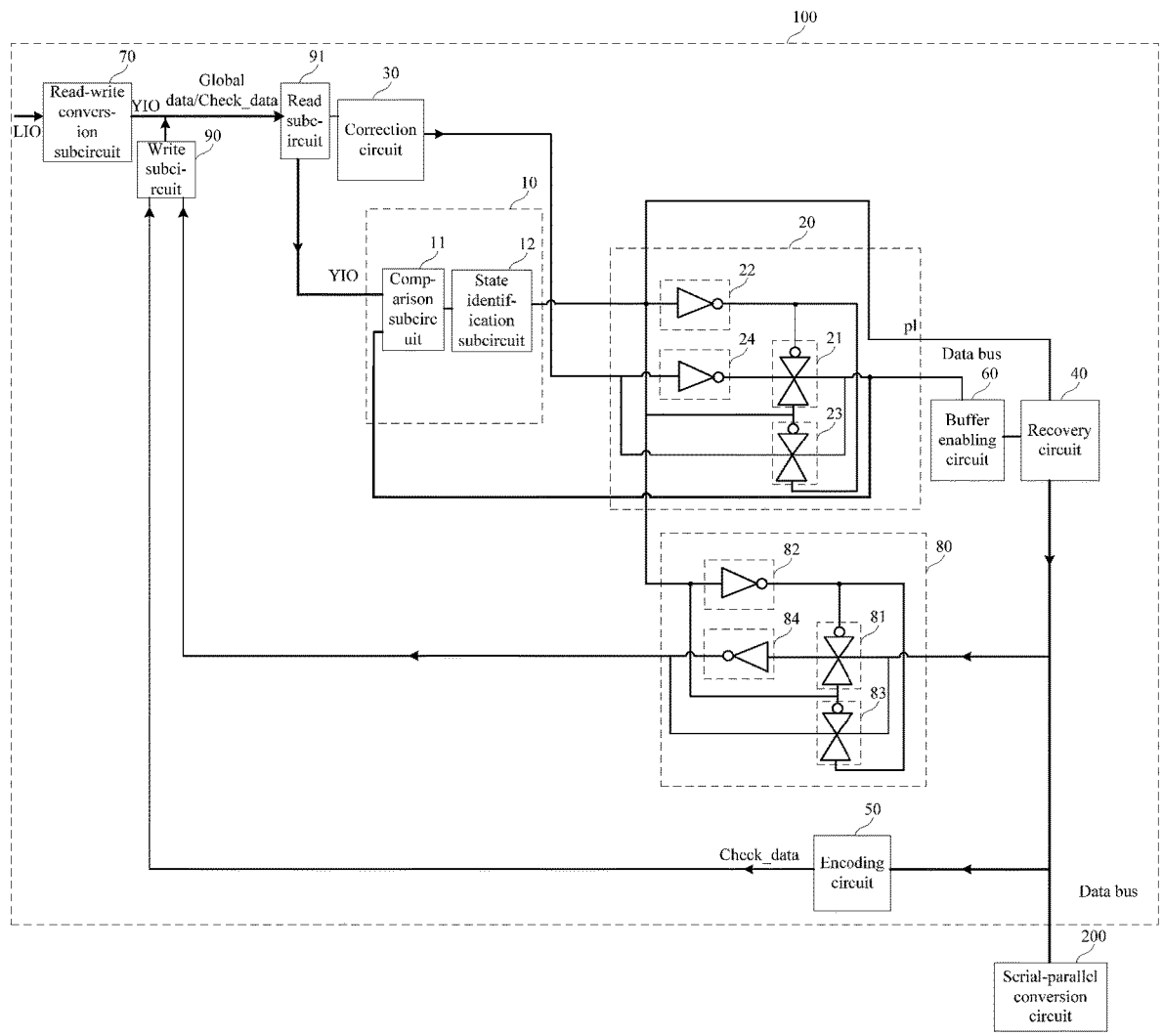
FIG. 9 is a schematic diagram of a circuit principle of a data transmission circuit provided in the ninth embodiment of the present disclosure.

Further, please refer to FIG. 9, in an embodiment of the present disclosure, the data transmission circuit 100 may also include a write subcircuit 90 and a read subcircuit 91.

The write subcircuit 90 is electrically connected with the second data conversion circuit 80 and the global data line YIO, and is configured to transmit the data provided by the second data conversion circuit 80 to the global data line YIO, or invert the data provided by the second data conversion circuit 80 and transmit the inverted data to the global data line YIO, to restore the data flipped by the second data conversion circuit 80 and ensure the accuracy of the write data transmitted to the global data line YIO while reducing the power consumption in the process of write data transmission. The read subcircuit 91 is electrically connected with the global data line YIO, the correction circuit 30 and the comparison circuit 10, and is configured to transmit the global data on the global data line YIO and the check data on the global data line YIO to the correction circuit 30, so that the correction circuit 30 can perform error detection and/or error correction on global data according to the check data to generate corrected data. The read subcircuit 91 is also configured to transmit the global data on the global data line YIO to the comparison circuit 10, so that the comparison circuit 10 can compare the global data on the global data line YIO with the bus data on the data bus, so as to output the comparison result on whether the different bits between the global data and the bus data exceed the preset threshold.

Figure 10:
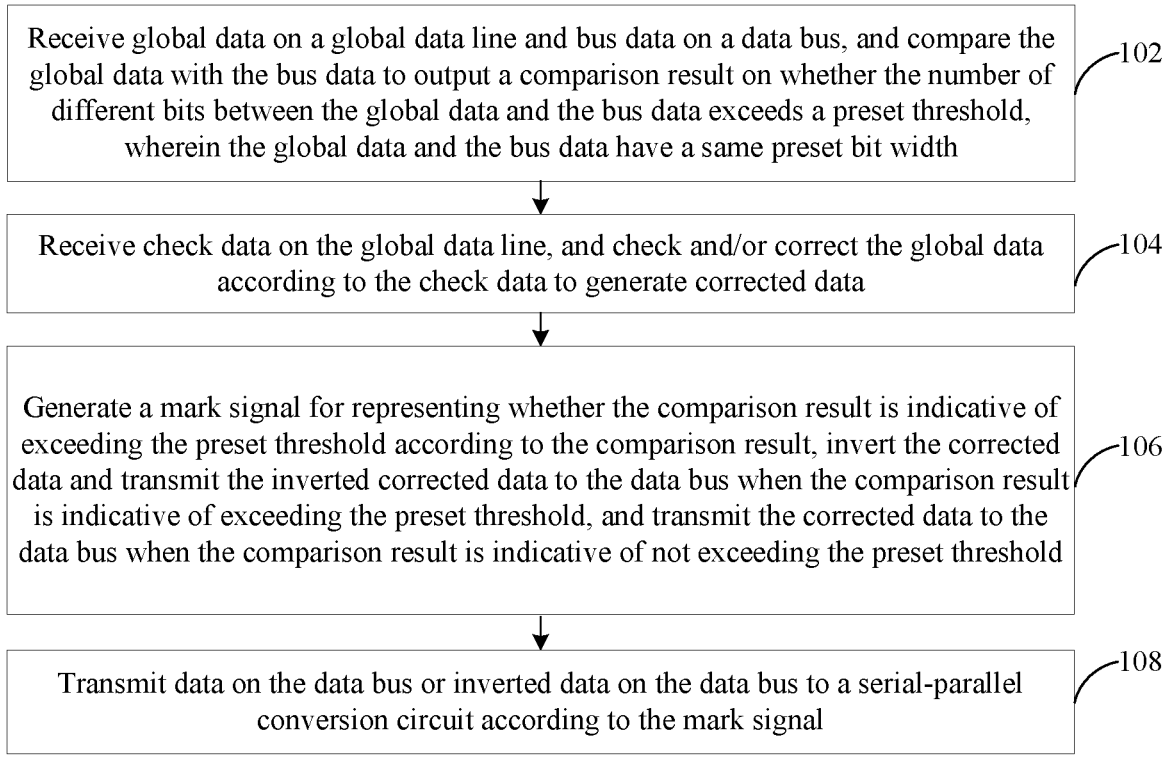
FIG. 10 is a schematic flowchart of a data transmission method provided in an embodiment of the present disclosure.

Further, please refer to FIG. 10, in an embodiment of the present disclosure, a data transmission method is provided, which includes the following operations 102 to 108.

At 102, global data on a global data line and bus data on a data bus are received, and the global data is compared with the bus data to output a comparison result on whether the number of different bits between the global data and the bus data exceeds a preset threshold, wherein the global data and the bus data have a same preset bit width.

At 104, check data on the global data line is received, and the global data is checked and/or corrected according to the check data to generate corrected data.

At 106, a mark signal for representing whether the comparison result is indicative of exceeding the preset threshold is generated according to the comparison result, the corrected data is inverted and transmitted to the data bus when the comparison result is indicative of exceeding the preset threshold, and the corrected data is transmitted to the data bus when the comparison result is indicative of not exceeding the preset threshold.

At 108, data on the data bus or inverted data on the data bus is transmitted to a serial-parallel conversion circuit according to the mark signal.

Please continuously refer to FIG. 10, in some exemplary implementations, the global data on the global data line is compared with the bus data on the data bus to output a comparison result on whether the number of different bits between the global data and the bus data exceeds a preset threshold, wherein the global data and the bus data have a same preset bit width. The global data is checked and/or corrected according to the check data on the global data line to generate corrected data. Then, a mark signal for representing whether the comparison result is indicative of exceeding the preset threshold is generated according to the comparison result, the corrected data is inverted and transmitted to the data bus when the comparison result is indicative of exceeding the preset threshold, and the corrected data is transmitted to the data bus when the comparison result is indicative of not exceeding the preset threshold. Therefore, data on the data bus or inverted data on the data bus is transmitted to the serial-parallel conversion circuit according to a value of the mark signal, and the read data is output in batches through the serial-parallel conversion circuit.

Since the transmitted data generally includes a data string composed of 0 and 1, a power saving algorithm is applied to the data transmission process to reduce the number of data flipping in the batch output of the read data through the global data line, the data bus and the serial-parallel conversion circuit without changing the transmission path of the read data, and effectively reduce the power consumption of the read data in the transmission process. Since error detection (also referred to as checking) and/or error correction are performed on the global data output through the global data line during data reading, the accuracy of the read data is guaranteed. Therefore, the embodiment reduces the power consumption in the process of reading data from a memory cell array and improves the accuracy of the read data without reducing the density and the number of memory cells in a memory cell array.

Figure 11:
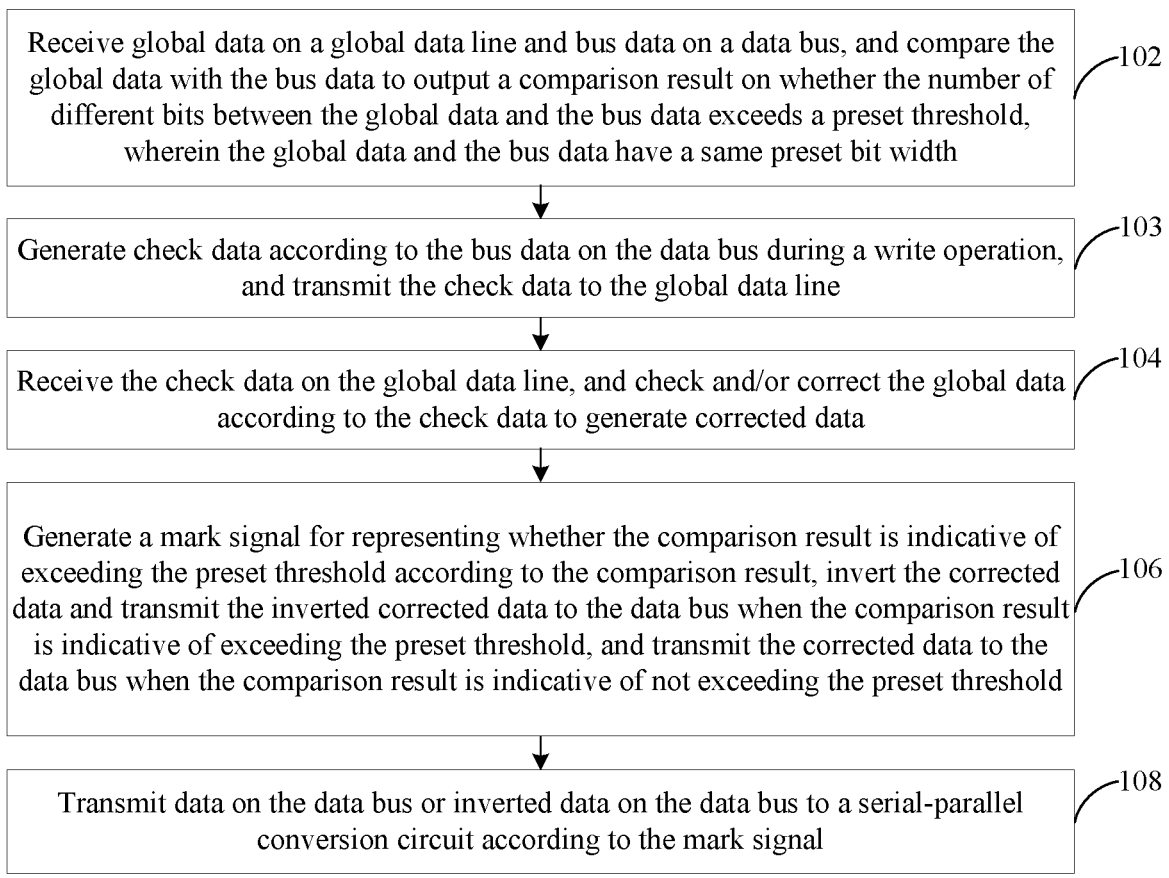
FIG. 11 is a schematic flowchart of a data transmission method provided in another embodiment of the present disclosure.

As an example, please refer to FIG. 11, in an embodiment of the present disclosure, the preset threshold is half of the preset bit width. Before receiving the check data, the method may include the following operation 103.

At 103, during a write operation, the check data is generated according to the bus data on the data bus, and the check data is transmitted to the global data line.

Please continuously refer to FIG. 11, in some exemplary implementations, an encoding circuit may be configured to generate the check data according to the bus data on the data bus during a write operation, so that the correction circuit can perform error detection and/or error correction on the global data according to the check data during the read operation to ensure the accuracy of the read data. For example, the ECC encoding subcircuit may be configured to generate an ECC check code according to the bus data on the data bus during a write operation, so that the error detection and/or error correction of the global data can be performed according to the ECC check code to ensure the accuracy of the read data.

According to an embodiment of the present disclosure, a computer readable storage medium is provided, on which a computer program is stored, and the data transmission method in any embodiment of the present disclosure is achieved when the computer program is executed by a processor.

It is to be understood that, although the various operations in the flowcharts of FIG. 10 and FIG. 11 are displayed in sequence as indicated by the arrows, these operations are not necessarily executed in sequence in the order indicated by the arrows. Unless explicitly stated in the description, there are no strict sequence restrictions on the execution of these operations, and these operations may be executed in other order. Unless otherwise specified herein, there is no strict order for the execution of these operations, and these operations can be executed in other orders. Moreover, at least part of the operations in FIG. 10 and FIG. 11 may include a plurality of operations or a plurality of stages. These operations or stages are not necessarily executed at a same time, but can be executed at different times. These operations or stages are not necessarily executed in sequence, but may be executed in turns or alternately with other operations or at least a part of the operations or stages in other operations.

Those having ordinary skill in the art will appreciate that implementing all or part of the processes in the methods described above may be accomplished by instructing associated hardware by a computer program, which may be stored in a non-volatile computer-readable storage medium. The computer program, when executed, may execute processes provided in the embodiments of the methods described above. Any reference to a memory, storage, a database, or other media used in the embodiments provided herein may include nonvolatile and/or volatile memories. A nonvolatile memory may include a Read-Only Memory (ROM), a Programmable ROM (PROM), an Electrically Programmable ROM (EPROM), an Electrically Erasable Programmable ROM (EEPROM), or a flash memory. A volatile memory may include a Random Access Memory (RAM) or an external cache memory. As not a limitation but an illustration, the RAM is available in many forms, such as a Static RAM (SRAM), a Dynamic RAM (DRAM), a Synchronous DRAM (SDRAM), a Double Data Rate SDRAM (DDRSDRAM), an Enhanced SDRAM (ESDRAM), a Synchronous Chain Channel (Synchlink) DRAM (SLDRAM), a Rambus Direct RAM (RDRAM), a Direct Memory Bus Dynamic RAM (DRDRAM), and a Memory Bus Dynamic RAM (RDRAM), among others.

Note that the above-described embodiments are only intended for illustrative purposes and are not meant to limit the present disclosure.

Each technical feature of the above mentioned embodiments may be combined freely. For simplicity of description, not all possible combinations of each technical solution in the above mentioned embodiments are described. However, any combination of these technical features shall fall within the scope recorded in the specification if there is no conflict.

The above mentioned embodiments only express some implementations of the present disclosure and are specifically described in detail and not thus understood as limits to the patent scope of the present disclosure. It is to be pointed out that those having ordinary skill in the art may further make a plurality of transformations and improvements without departing from the concept of the present disclosure and all of these shall fall within the scope of protection of the present disclosure. Therefore, the scope of patent protection of the present disclosure should be subject to the appended claims.

What is claimed is:

1. A data transmission circuit, comprising:
    a comparison circuit, electrically connected with a global data line and a data bus, and configured to receive global data on the global data line and bus data on the data bus and compare the global data with the bus data to output a comparison result on whether the number of different bits between the global data and the bus data exceeds a preset threshold, wherein the global data and the bus data have a same preset bit width;
    a correction circuit, electrically connected with the global data line, and configured to receive the global data and check data on the global data line, and check and/or correct the global data according to the check data to generate corrected data;
    a first data conversion circuit, electrically connected with the data bus, the comparison circuit and the correction circuit, and configured to invert the corrected data and transmit the inverted corrected data to the data bus when the comparison result is indicative of exceeding the preset threshold, and transmit the corrected data to the data bus when the comparison result is indicative of not exceeding the preset threshold, wherein the first data conversion circuit is further configured to output a mark signal for representing whether the comparison result is indicative of exceeding the preset threshold; and
    a recovery circuit, electrically connected with the data bus and a serial-parallel conversion circuit, and configured to transmit data on the data bus or inverted data on the data bus to the serial-parallel conversion circuit according to a value of the mark signal.

2. The data transmission circuit according to claim 1, further comprising:
    an encoding circuit, electrically connected with the global data line and the data bus, and configured to generate the check data according to the bus data on the data bus during a write operation and transmit the check data to the global data line.

3. The data transmission circuit according to claim 2, wherein the encoding circuit comprises an Elliptic Curve Cryptography (ECC) coding subcircuit.

4. The data transmission circuit according to claim 1, wherein the length of a data transmission path between the recovery circuit and the serial-parallel conversion circuit is shorter than the length of a data transmission path between the recovery circuit and the first data conversion circuit.

5. The data transmission circuit according to claim 4, further comprising at least one buffer enabling circuit, wherein
    the first data conversion circuit is sequentially connected with the recovery circuit through at least one buffer enabling circuit so as to buffer data transmitted by the data bus.

6. The data transmission circuit according to claim 1, wherein the preset threshold is half of the preset bit width; and the comparison circuit comprises:
    a comparison subcircuit, configured to compare the global data and bus data bit by bit and output comparison state data for each bit; and
    a state identification subcircuit, electrically connected with the comparison subcircuit and the first data conversion circuit, and configured to make statistics on the comparison state data for each bit and generate the comparison result according to a statistical result.

7. The data transmission circuit according to claim 6, wherein the first data conversion circuit comprises:
    a first transmission subcircuit, electrically connected to the data bus and the correction circuit, and electrically connected to an output end of the state identification subcircuit through a first inverting subcircuit, and configured to transmit the corrected data to the data bus when the comparison result is indicative of not exceeding the preset threshold; and
    a second transmission subcircuit, electrically connected to the data bus and the output end of the state identification subcircuit, and is electrically connected to the correction circuit through a second inverting subcircuit, and configured to invert the corrected data and transmit the inverted corrected data to the data bus when the comparison result is indicative of exceeding the preset threshold.

8. The data transmission circuit according to claim 1, wherein the recovery circuit is configured to invert the data on the data bus and transmit the data to the serial-parallel conversion circuit when the comparison result is indicative of exceeding the preset threshold, and transmit the data on the data bus to the serial-parallel conversion circuit when the comparison result is indicative of not exceeding the preset threshold.

9. The data transmission circuit according to claim 1, further comprising:
    a read-write conversion subcircuit, electrically connected with a local data line and the global data line, and configured to, in response to a read command, generate the global data according to data on the local data line, and transmit the global data to the global data line.

10. The data transmission circuit according to claim 1, further comprising:
a second data conversion circuit, electrically connected with the comparison circuit, the data bus and the global data line, and configured to invert the data on the data bus and transmit the inverted data to the global data line when the comparison result is indicative of exceeding the preset threshold, and transmit the data on the data bus to the global data line when the comparison result is indicative of not exceeding the preset threshold.

11. The data transmission circuit according to claim 10, wherein the second data conversion circuit comprises:
a third transmission subcircuit, electrically connected to the data bus and the global data line, and electrically connected to an output end of the comparison circuit through a third inverting subcircuit, and configured to transmit the data on the data bus to the global data line when the comparison result is indicative of not exceeding the preset threshold; and
a fourth transmission subcircuit, electrically connected to the global data line and the output end of the comparison circuit, and electrically connected to the data bus through a fourth inverting subcircuit, and configured to invert the data on the data bus and transmit the inverted data to the global data line when the comparison result is indicative of exceeding the preset threshold.

12. The data transmission circuit according to claim 11, further comprising:
a write subcircuit, electrically connected with the second data conversion circuit and the global data line, and configured to transmit the data provided by the second data conversion circuit to the global data line, or invert the data provided by the second data conversion circuit and transmit the inverted data to the global data line; and
a read subcircuit, electrically connected with the global data line, the correction circuit and the comparison circuit, and configured to transmit the global data and the check data on the global data line to the correction circuit, and transmit the global data to the comparison circuit.

13. A memory device, comprising:
a data transmission circuit, configured to store and transmit data of a read operation or a write operation, and comprising:
a comparison circuit, electrically connected with a global data line and a data bus, and configured to receive global data on the global data line and bus data on the data bus and compare the global data with the bus data to output a comparison result on whether the number of different bits between the global data and the bus data exceeds a preset threshold, wherein the global data and the bus data have a same preset bit width;
a correction circuit, electrically connected with the global data line, and configured to receive the global data and check data on the global data line, and check and/or correct the global data according to the check data to generate corrected data;
a first data conversion circuit, electrically connected with the data bus, the comparison circuit and the correction circuit, and configured to invert the corrected data and transmit the inverted corrected data to the data bus when the comparison result is indicative of exceeding the preset threshold, and transmit the corrected data to the data bus when the comparison result is indicative of not exceeding the preset threshold, wherein the first data conversion circuit is further configured to output a mark signal for representing whether the comparison result is indicative of exceeding the preset threshold; and
a recovery circuit, electrically connected with the data bus and a serial-parallel conversion circuit, and configured to transmit data on the data bus or inverted data on the data bus to the serial-parallel conversion circuit according to a value of the mark signal.

14. A data transmission method, comprising:
receiving global data on a global data line and bus data on a data bus, and comparing the global data with the bus data to output a comparison result on whether the number of different bits between the global data and the bus data exceeds a preset threshold, wherein the global data and the bus data have a same preset bit width;
receiving check data on the global data line, and checking and/or correcting the global data according to the check data to generate corrected data;
generating a mark signal for representing whether the comparison result is indicative of exceeding the preset threshold according to the comparison result, inverting the corrected data and transmitting the inverted corrected data to the data bus when the comparison result is indicative of exceeding the preset threshold, and transmitting the corrected data to the data bus when the comparison result is indicative of not exceeding the preset threshold; and
transmitting data on the data bus or inverted data on the data bus to a serial-parallel conversion circuit according to the mark signal.

15. The data transmission method according to claim 14, wherein the preset threshold is half of the preset bit width; before receiving the check data, the data transmission method comprises:
generating the check data according to the bus data on the data bus during a write operation, and transmitting the check data to the global data line.

16. The memory device according to claim 13, wherein the data transmission circuit further comprises:
an encoding circuit, electrically connected with the global data line and the data bus, and configured to generate the check data according to the bus data on the data bus during a write operation and transmit the check data to the global data line.

17. The memory device according to claim 13, wherein the length of a data transmission path between the recovery circuit and the serial-parallel conversion circuit is shorter than the length of a data transmission path between the recovery circuit and the first data conversion circuit.

18. The memory device according to claim 13, wherein the preset threshold is half of the preset bit width; and the comparison circuit comprises:
a comparison subcircuit, configured to compare the global data and bus data bit by bit and output comparison state data for each bit; and
a state identification subcircuit, electrically connected with the comparison subcircuit and the first data conversion circuit, and configured to make statistics on the comparison state data for each bit and generate the comparison result according to a statistical result.

19. The memory device according to claim 13, wherein the recovery circuit is configured to invert the data on the data bus and transmit the data to the serial-parallel conversion circuit when the comparison result is indicative of exceeding the preset threshold, and transmit the data on the data bus to the serial-parallel conversion circuit when the comparison result is indicative of not exceeding the preset threshold.

20. The memory device according to claim 13, wherein the data transmission circuit further comprises:
   a second data conversion circuit, electrically connected with the comparison circuit, the data bus and the global data line, and configured to invert the data on the data bus and transmit the inverted data to the global data line when the comparison result is indicative of exceeding the preset threshold, and transmit the data on the data bus to the global data line when the comparison result is indicative of not exceeding the preset threshold.

* * * * *